United States Patent
Iino et al.

[11] Patent Number: 5,871,578
[45] Date of Patent: Feb. 16, 1999

[54] METHODS FOR HOLDING AND PULLING SINGLE CRYSTAL

[75] Inventors: Eiichi Iino; Makoto Iida; Masanori Kimura, all of Annaka; Shozo Muraoka, Maebashi, all of Japan

[73] Assignee: Shin-Etsu Handotai Co., Ltd., Tokyo, Japan

[21] Appl. No.: 915,397

[22] Filed: Aug. 20, 1997

[30] Foreign Application Priority Data

Aug. 30, 1996 [JP] Japan ........................ 8-249182

[51] Int. Cl.$^6$ .................................................. C30B 15/32
[52] U.S. Cl. ........................ 117/13; 117/15; 117/30; 117/32; 117/917
[58] Field of Search .................. 117/14, 15, 30, 117/32, 201, 917, 13

[56] References Cited

FOREIGN PATENT DOCUMENTS

| A1 0-286133 | 10/1988 | European Pat. Off. |
| A2 0-449260 | 10/1991 | European Pat. Off. |
| A1 0-446457 | 1/1992 | European Pat. Off. |
| A 62-288191 | 12/1987 | Japan. |
| A 63-252991 | 10/1988 | Japan. |
| A 3-295893 | 12/1991 | Japan. |
| A3-285893 | 12/1991 | Japan. |

*Primary Examiner*—Felisa Hiteshew
*Attorney, Agent, or Firm*—Oliff & Berridge, PLC

[57] ABSTRACT

Oscillation of a growing crystal is suppressed in a Czochralski method when part of the growing crystal is mechanically held. Methods for holding and pulling a single crystal in a Czochralski method, wherein a seed crystal is pulled while rotating after the seed crystal is contacted with a raw material melt, part of the growing single crystal is mechanically held during pulling and the single crystal of heavy weight can be pulled regardless of mechanical strengths of the seed crystal or a neck portion thereof, wherein the raw material melt is under application of a magnetic field thereto when the growing crystal is mechanically held.

10 Claims, 2 Drawing Sheets

METHODS FOR HOLDING AND PULLING SINGLE CRYSTAL

BACKGROUND OF THE INVENTION

1. Field of the Invention

The present invention relates to a method for pulling a single crystal of heavy weight by a Czochralski method regardless of a mechanical strength of a seed and a necking portion thereof by mechanically holding a part of a growing crystal during growth.

2. Related Art

A Czochralski method has been conventionally known as a method producing semiconductor material such as silicon, which, for example, as shown in FIG. 2(A), comprises the steps of: contacting a seed crystal 52 held by a seed holder 51 with the surface of a raw material melt 54 contained in a crucible 53; then pulling the seed crystal 52 adjusting its speed, while rotating the seed crystal 52 about its rotational axis, to form a neck portion 55 under the seed crystal 52; and in succession growing a cylindrical body 56 of a single crystal with a larger diameter.

In the Czochralski method, the cylindrical body 56 of a grown crystal under the seed crystal 52 can be produced dislocation-free by forming the neck portion 55. In recent years, however, the weight of a single crystal has been on the continuous increase because of demand for a single crystal with a larger diameter or for the purpose of improvement of production efficiency, in which trend nearly insufficient mechanical strengths of a seed crystal 52 and a neck portion 55 have been often experienced. If the neck portion 55 should be broken to let a growing single crystal to be fallen down, there would be a fear of a serious accident. To cope with such an accident, a method and apparatus for mechanically holding a part of a crystal during crystal growth has been adopted, for example, as shown in FIG. 2(B).

In the apparatus of the figure, a stepped engagement portion 57, which is composed of an expanded-diameter portion and a reduced-diameter portion, is formed between a neck portion 55 and a cylindrical body 56 and the stepped engagement portion 57 is held between lifting jigs 58, 58 to pull a growing single crystal. As such techniques, the following literature has been known:, for example, Laid-open Japanese patent applications 62-288191, 63-252991, 3-285893, 3-295893 and the like. Among them, for example, in the case of Laid-open Japanese patent application 3-285893, a seed crystal is pulled while the stepped engagement portion 57 is formed and when the stepped engagement portion 57 reaches a position where lifting jigs 58, 58 are located, the jigs 58, 58 catch the stepped engagement portion 57 and crystal pulling is continued while being held by the jigs 58, 58.

In the conventional method as described above, the weight of the growing single crystal is effectively sustained but, since the lifting jigs 58, 58 contact with the crystal in their motion along a lateral direction when the crystal is caught by the lifting jigs 58, 58, which is apt to generate a force directed to the crystal in the direction, there arises a problem that the single crystal is swayed and has a chance for oscillation thereof to occur.

In the same case, there arises another problem; when a growing crystal is held by mechanical means, a central axis of rotation in a pulling mechanism of a single crystal, which holds a growing single crystal in an earlier stage, has in practical sense an error, which is small, in alignment with a central axis of rotation of a holding mechanism holding the single crystal in a later stage, though the central axes of rotation are required to be a perfect alignment with each other. In such a situation, when pinching action of the lifting jigs 58, 58 is effected, a plurality of the tips of the jigs 58, 58 do not all touch the crystal with one accord and one of them touches in advance of the others, so that the growing crystal is forced to sway and oscillate.

As described above, it is generally difficult to catch a part of a growing crystal for mechanically holding in a Czochralski method without giving any oscillation to the crystal. And once the growing crystal sways and the oscillation occurs, the crystal is subject to starting to grow with dislocations and to produce bends in the crystal and, as a result, a yield of single crystal is reduced, and, if the oscillation is extreme, shut-down of the pulling process becomes the single choice.

In such circumstances, effective means for suppressing oscillation of a growing crystal has been accordingly desired in a Czochralski method, in a case where part of the growing crystal is mechanically held.

SUMMARY OF THE INVENTION

A first aspect of the present invention is directed to a method for holding a growing single crystal in a Czochralski method, wherein a seed crystal is pulled while rotating after the seed crystal is contacted with a raw material melt, part of the growing single crystal is mechanically held during growth and the single crystal of heavy weight can be pulled regardless of a mechanical strengths of the seed crystal or a neck portion thereof, characterized in that a magnetic field is applied to the raw material melt.

If a magnetic field is applied to a raw material melt while part of a growing crystal is mechanically held, an apparent viscosity of the melt is increased by the magnetic field and thereby oscillation of the crystal can be suppressed.

A second aspect of the present invention is directed to a method for pulling a single crystal in a Czochralski method, wherein a seed crystal is pulled while rotating after the seed crystal is contacted with a raw material melt, part of the growing single crystal is mechanically held during pulling and the single crystal of heavy weight can be pulled regardless of a mechanical strengths of the seed crystal or a neck portion thereof, characterized in that a magnetic field is applied to the raw material melt.

When a magnetic field is applied to a raw material melt while part of a growing crystal is mechanically held, a viscosity of the melt is increased by the magnetic field and thereby oscillation of the crystal is suppressed. Accordingly, if a single crystal is grown in such a way, there does not occur such problems that the growing crystal becomes a crystal with dislocations or a bent crystal grows.

In the second aspect, the application of the magnetic field may be effected continuously during the pulling of a crystal. The magnetic field may be applied to the melt only during the time when an action is made to mechanically hold a growing crystal, in the growth of which oscillation is problematic, according to a third aspect of the present invention.

A magnetic field is also effectively applied to suppress oscillation of a crystal just after it actually occurs, according to a fourth aspect of the present invention and the fourth aspect is also applicable to oscillation arising in other cases than holding by the mechanical means as above mentioned.

According to the present invention, it is desired that a magnetic field strength is 500 gauss or more in the vicinity of a crystal growing boundary in order to effectively suppress oscillation of a growing single crystal.

Now, the present invention will be in detail described, but it should be noted that the following description does not limit the scope of the present invention.

As described above, a conventional method for mechanically holding a crystal is to pinch a growing crystal in a lateral direction with lifting jigs and thereby the crystal necessarily receives a lateral force, which, with ease, causes the crystal to oscillate by swaying it to and fro.

Besides, a central axis of rotation of a crystal pulling mechanism, which holds a crystal in an earlier stage, has difficulty in perfect alignment with a central axis of rotation of a holding mechanism for sustaining the crystal in a later stage, which actually causes an error, though it is small, in alignment between the central axes, even if mechanical precision of both mechanisms is further increased.

Since there is a length from a holding portion of a single crystal to a crystal growing boundary, even a small amplitude of sway of the crystal at the holding portion becomes larger at the crystal growing boundary in accordance with the length of the growing crystal, that is small sway caused in a holding action is resulted in largely affected crystal growing.

A viscosity of a silicon melt is considerably small, for which reason a growing crystal is oscillated with ease even with a small force applied.

Therefore, it is difficult to complete a holding action without giving any oscillation to a growing crystal, when the growing crystal is pinched to mechanically hold in a Czochralski method.

The inventors has reached the present invention based on an acquired concept after a serious research which has been conducted with a recognition that countermeasures, such as further increase precision of an apparatus itself mechanically holding a growing crystal and the like, have a limit and is poor in effectiveness, said concept being that increase in viscosity of a raw material melt makes it difficult for the crystal to oscillate even under influence of a force directed to the crystal in a mechanical holding action or the increase in viscosity suppresses the oscillation, even if it occurs.

That is, as described above, since the Prandtl number of a silicon melt is considerably small and the viscosity is low, a growing crystal is easy to oscillate by a small force directed thereto. By increasing the apparent viscosity with a magnetic field applied on the raw material melt, oscillation of the growing crystal in a holding action is suppressed or by temporary application of the magnetic field, oscillation of the growing crystal which has already occurred can be suppressed.

It is enough that application of a magnetic field to a raw material melt is effected only when a growing crystal, oscillation of which is problematic, is pinched by a mechanical means for holding but the application may be continuously effected through all the pulling.

Application of a magnetic field according to the present invention is effectively adapted to suppress oscillation of a growing crystal when it is actually oscillated by some cause or other without limiting to the case where the growing crystal is held by a mechanical means held.

A expression of when a part of a growing crystal is mechanically held used in the present specification is to be interpreted not the instant when the growing crystal is caught by a holding device but a span of time including before and after the instant. Especially, the expression includes a time interval, in which the growing crystal is under oscillation caused by the action of holding.

As to an applied magnetic field, no special restrictions are imposed on a form of application, a type of apparatus and the like and any type of magnetic field may be adopted as far as the viscosity of a raw material melt can be increased by it. For example, a horizontal magnetic field may be used, wherein a permanent magnet and/or a coil is mounted in a surrounding manner outside a puller of a Czochralski method and a magnetic field is applied in a horizontal direction and a vertical magnetic field may also be used, wherein a magnetic field is applied in a vertical direction to a region in the vicinity of a crystal growing boundary. Moreover, a cusp magnetic field may be used, wherein two coils are disposed in parallel to each other and currents in opposed directions are made to flow therein respectively.

In any type of magnetic field application, a strength is preferred to be 500 gauss or more in the vicinity of a crystal growing boundary. With less than 500 gauss, in some cases, oscillation of a growing crystal cannot be sufficiently suppressed.

BRIEF DESCRIPTION OF THE DRAWINGS

Novel features which are considered characteristic of the present invention are set forth with particularity in the appended claims.

The invention itself, however, and additional objects and advantages thereof will best be understood from the following description thereof when read in connection with accompanying drawings, in which:

FIGS. 2(A) and 2(B) are schematic side views illustrating a conventional method, wherein FIG. 2(A) shows crystal pulling by a conventional Czochralski method and FIG. 2(B) shows a conventional method for holding a crystal.

DETAILED DESCRIPTION OF THE INVENTION

An embodiment of the present invention will be described in reference to the accompanied drawings, but it should be understood that the present invention is not restricted to the following description.

Figure 1:
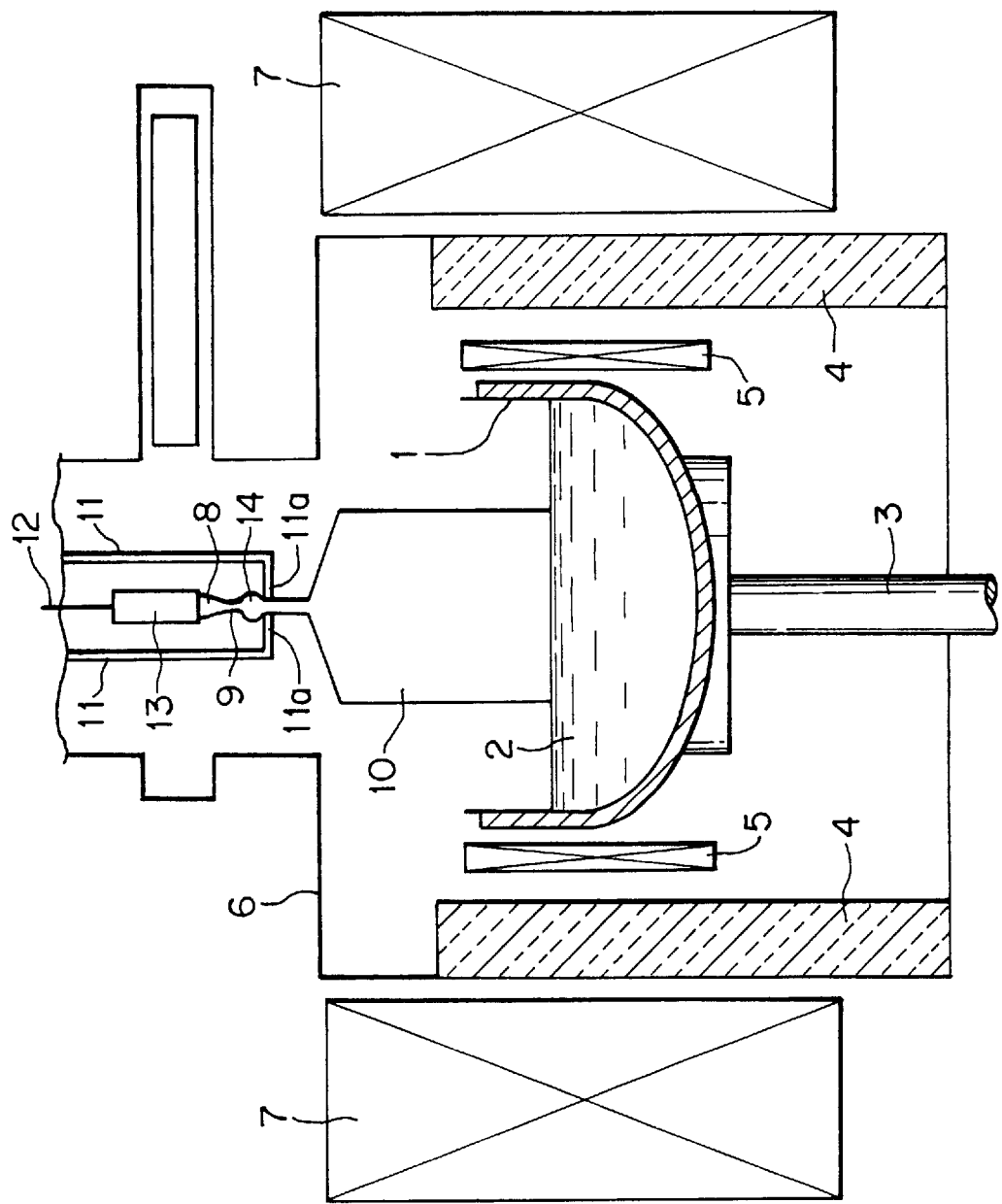
FIG. 1 is a schematic global view showing an example of a crystal puller by means of a Czochralski method, wherein a horizontal magnetic field can be applied to a raw material melt, for practicing a method of the present invention.
Figure 2A:
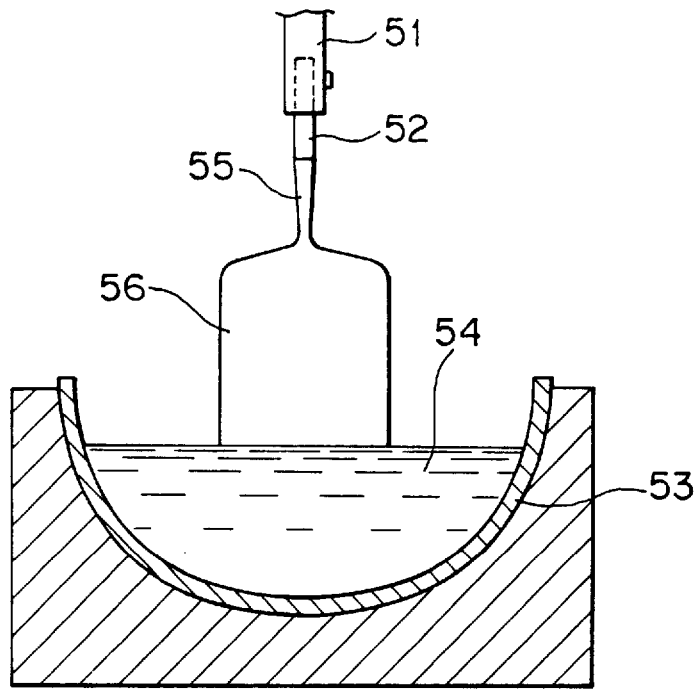
Figure 2B:
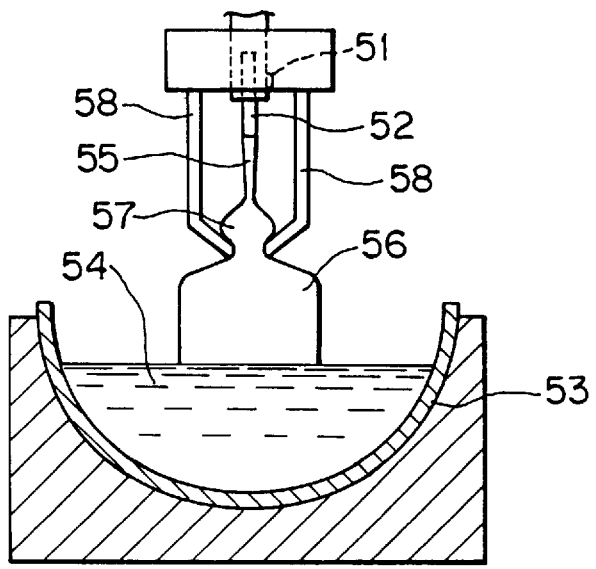

FIG. 1 is a schematic global view showing an example of a crystal puller by means of a Czochralski method, wherein a horizontal magnetic field can be applied to a raw material melt, for practicing a method of the present invention.

In FIG. 1, 1 denotes a quartz crucible which contains a silicon melt 2 and the crucible 1 can rotate about its rotational axis 3. A cylindrical heater 5, for example, made of graphite is disposed outside the crucible 1 in a surrounding manner. Outside the heater 5, a heat insulating cylinder 4 is further disposed, when circumstances requires. A magnet field generator 7 comprising permanent magnets or electromagnets is installed outside a chamber 6. 8 denotes a seed crystal made of single crystal silicon and a single crystal is pulled upwardly while rotating by a pulling mechanism (not shown) along a central axis thereof. 11 denotes a crystal holding apparatus which functions so as to mechanically catch and hold the growing crystal when it grows up to a predetermined length.

In such an apparatus, a method of the present invention is practiced in the following way:

A seed crystal 8 fixedly mounted to a seed holder 13, which is hung by the lower end of a wire 12, is contacted with the surface of the raw material melt 2 and, when the wire 12 is pulled upwardly at a predetermined speed while quietly rotating by the pulling mechanism not shown, a single crystal is grown on the lower end of the seed crystal 8. After a neck portion 9 is formed in order to grow single crystal, a stepped engagement portion 14, which is used to hold the growing crystal mechanically, is formed before a cylindrical body 10 of the single crystal is grown. In this case, holding portions 11a, 11a of lifting jigs on opposed sides of a crystal holding apparatus 11 are kept open and the crystal holding apparatus 11 starts working so as to mechanically hold the growing single crystal in a manner to pinch the stepped engagement portion 14 with the holding portions 11a, 11a of lifting jigs on the way where the single crystal is pulled by the wire 12, when the stepped engagement portion 14, which resides between the neck portion 9 and the head of the cylindrical body 10, reaches a predetermined height in the vicinity of a position ahead of the holding portions 11a, 11a of lifting jigs and a sensor, not shown, detects the situation.

On this occasion, a horizontal magnetic field from the magnetic field generator 7 is applied to the raw material melt 2 to increase a viscosity of the melt especially in the vicinity of a crystal growing boundary, so that oscillation of the growing crystal caused by swaying is suppressed.

Examples and Comparative Examples

The examples and comparative examples will be described below:

An apparatus as shown in FIG. 1 was used and a relation between the oscillation of a growing crystal and the strength of a magnetic field including a case of no application of the magnetic field was investigated, wherein a growing crystal of 6 inches in diameter was mechanically held by a crystal holding apparatus at a length of a cylindrical body grown of 80 cm.

A direction of the magnetic field was a horizontal direction and strengths of the magnetic field were those in the vicinity of a contacting point (a crystal growing boundary) of the periphery of the growing crystal with the raw material melt. Oscillation is meant as the maximal amplitude in mm measured after 5 seconds were passed from an instant of contact of the holding levers and it was assumed as no oscillation when the oscillation ceased within 5 seconds of the instant of contact of the holding portions of lifting jigs. The results are shown in Table 1.

TABLE 1

| Magnetic field strengths in gauss | Oscillation in mm |
|---|---|
| 0 | 5 |
| 250 | 2 |
| 500 | none |
| 1000 | none |
| 2000 | none |

As clearly seen from Table 1, when the magnetic field is not applied, a growing crystal is continued to sway for 5 seconds or more and amplitudes of list oscillation are large, which provides a fear that a crystal grows with dislocation and, besides, the crystal grows in a bent form. In the cases where magnetic field are applied, the oscillation is diminished and especially with a magnetic field strength of 500 gauss, the oscillation is effectively suppressed.

Here, again, it should be confirmed that the present invention is not restricted to the above embodiment and the above embodiment has been given as exemplary only. All changes and modifications thereof are intended to be covered with the technical scope of the present invention as far as they essentially have the same constitutions as the scope described in the appended claims and the same functions and effects as those of the appended claims.

For example, the case where a silicon single crystal was grown by means of a Czochralski method has been described in the above embodiment. However, the present invention is basically applicable to any case where a Czochralski method is used to grow a crystal and a growing crystal is mechanically held and its application is not restricted only to the above embodiment. For example, cases, where a compound semiconductor single crystal or an oxide single crystal is grown, are also within the scope of application of the present invention in a similar way to that as described above.

As described above, in a method of the present invention wherein crystal growing by means of a Czochralski method is effected in order to pull a single crystal with heavy weight regardless of strengths of-a seed crystal and a neck portion thereafter while part of the growing single crystal is mechanically held, a viscosity of the melt is increased by a magnetic field effect and thereby oscillation of the growing crystal can be suppressed, since a magnetic field is applied to a raw material melt when part of the growing crystal is mechanically held. Therefore, when a crystal is grown according to such a method, problems of crystal growth with dislocations or bending of a grown crystal along its length can be solved, so that a crystal yield is improved.

What is claimed is:

1. A method for holding a growing single crystal in a Czochralski method, wherein a seed crystal is pulled while rotating after the seed crystal is contacted with a raw material melt, part of the growing single crystal becomes mechanically held at a time in the course of pulling and the single crystal of heavy weight can be pulled regardless of mechanical strengths of the seed crystal or a neck portion thereof, characterized in that a portion of the raw material melt in the vicinity of a crystal growing interface is under application of a magnetic field thereto when the growing crystal becomes mechanically held to thereby suppress oscillations in the single crystal while the crystal becomes mechanically held.

2. A method for holding a growing single crystal in a Czochralski method according to claim 1, wherein a strength of the magnetic field is 500 gauss or more in the vicinity of a crystal growing boundary.

3. A method for pulling a single crystal in a Czochralski method, wherein a seed crystal is pulled while rotating after the seed crystal is contacted with a raw material melt, part of the growing single crystal becomes mechanically held at a time in the course of pulling and the single crystal of heavy weight can be pulled regardless of a mechanical strength of the seed crystal or a neck portion thereof, characterized in that a portion of the raw material melt in the vicinity of a crystal growing interface is under application of a magnetic field thereto when the growing crystal becomes mechanically held to thereby suppress oscillations in the single crystal.

4. A method for pulling a single crystal in a Czochialski method according to claim 3, wherein the magnetic field is applied to the raw material melt only when the growing crystal gets mechanically held.

5. A method for pulling a single crystal in a Czochralski method according to claim 4, wherein a strength of the magnetic field is 500 gauss or more in the vicinity of a crystal growing boundary.

6. A method for pulling a single crystal in a Czochralski method according to claim 3, wherein a strength of the magnetic field is 500 gauss or more in the vicinity of a crystal growing boundary.

7. A method for pulling a single crystal in a Czochralski method, wherein a seed crystal is pulled while rotating after the seed crystal is contacted with a raw material melt, characterized in that a magnetic field is applied to a portion in the vicinity of the raw material melt in order to suppress oscillation of a growing crystal when it occurs.

8. A method for pulling a single crystal in a Czochralski method according to claim 7, wherein a strength of the magnetic field is 500 gauss or more in the vicinity of a crystal growing boundary.

9. A method for stabilizing a single crystal being grown according to the Czochralski method, comprising:

initiating growth of the single crystal;

applying a magnetic field to a melt in a vicinity of a crystal growing boundary to suppress oscillations in the single crystal;

gripping the single crystal using a mechanical crystal gripper; and removing the magnetic field.

10. A method for stabilizing a single crystal being grown according to the Czochralski method, comprising:

initiating growth of the single crystal;

recognizing an oscillation occurring in the single crystal;

applying a magnetic field to a melt in a vicinity of a crystal growing boundary to suppress oscillations in the single crystal;

maintaining the magnetic field to eliminate a determined amount of suppression of the oscillations; and removing the magnetic field.

* * * * *